(12) United States Patent
Lin et al.

(10) Patent No.: US 8,211,721 B2
(45) Date of Patent: Jul. 3, 2012

(54) METHODS FOR MAKING QUASI-VERTICAL LIGHT EMITTING DIODES

(75) Inventors: Limin Lin, New Territories (HK); Hung Shen Chu, New Territories (HK); Ka Wah Chan, New Territories (HK)

(73) Assignee: Hong Kong Applied Science and Technology Research Institute Co. Ltd., Hong Kong (CN)

( * ) Notice: Subject to any disclaimer, the term of this patent is extended or adjusted under 35 U.S.C. 154(b) by 0 days.

(21) Appl. No.: 13/074,807

(22) Filed: Mar. 29, 2011

(65) Prior Publication Data

US 2011/0169023 A1 Jul. 14, 2011

Related U.S. Application Data

(62) Division of application No. 12/415,103, filed on Mar. 31, 2009, now Pat. No. 7,939,847.

(51) Int. Cl.
*H01L 21/00* (2006.01)
(52) U.S. Cl. .................. 438/26; 257/E33.055
(58) Field of Classification Search .......... None
See application file for complete search history.

(56) References Cited

U.S. PATENT DOCUMENTS

| 5,612,231 | A  | * | 3/1997  | Holm et al. .......... 438/23 |
| 2006/0244005 | A1 |   | 11/2006 | Chen |
| 2010/0244082 | A1 |   | 9/2010  | Lin et al. |

* cited by examiner

*Primary Examiner* — Ha Tran T Nguyen
*Assistant Examiner* — Kevin Quinto
(74) *Attorney, Agent, or Firm* — Brooks Kushman P.C.

(57) ABSTRACT

A method of making quasi-vertical light emitting devices includes growing semiconductor layers on a growth substrate and etching the semiconductor layers to produce device isolation trenches forming separable semiconductor devices and holes. Blind holes are drilled in the substrate at the location of each of the holes in the semiconductor layers. The drilling of the blind holes defines blind hole walls and a blind hole end in each of the blind holes. N-semiconductor metal is deposited in each of the blind holes. An n-electrode contact is formed in each of the blind holes by plating each of the blind holes with an n-electrode metal connected to the n-semiconductor metal. The substrate is thinned to expose the n-electrode metal as an n-electrode. Bonding metal is deposited to the n-electrode for packaging.

17 Claims, 9 Drawing Sheets

METHODS FOR MAKING QUASI-VERTICAL LIGHT EMITTING DIODES

CROSS-REFERENCE TO RELATED APPLICATIONS

This application is a division of U.S. application Ser. No. 12/415,103, filed Mar. 31, 2009, now U.S. Pat. No. 7,939,847; the disclosure of which is incorporated by reference in its entirety.

TECHNICAL FIELD

The present invention relates to semiconductor devices, and more particularly, to a light emitting diode and method of making a light emitting diode.

BACKGROUND

Light emitting diodes (LEDs) are currently one of the most innovative and fastest growing technologies in the semiconductor industry. While LEDs have been in use for decades as indicators and for signaling purposes, technology developments and improvements have allowed for a broader use of LEDs in illumination applications.

Semiconductors that contain nitrogen (N) as the Group V element have proven to be useful for short-wavelength light emitting devices. Among these, extensive research has been conducted on gallium-nitride based semiconductors for use as light emitting diodes, such as $In_xGa1-_xN$ and $Al_xGa_yIn_zN$, and such light emitting diodes (LEDs) have already been put to practical use.

Generally, vertical GaN-based LEDs are grown on a sapphire substrate. The sapphire substrate is rigid and electrically nonconductive and has a low thermal conductivity. In a typical process for making a GaN-based LEDs, a plurality of GaN layers are grown on the sapphire substrate. One or more p-electrodes may then be formed on a p-type GaN layer, and the sapphire substrate is removed using a laser lift off (LLO) process, exposing the n-type layers for subsequent processes.

LLO is one technology used to remove sapphire. However, LLO introduces damage by laser-induced shock waves and can affect yield and result in problems in the device performance and reliability. The sapphire also can be removed by mechanical methods, including grinding, lapping and mechanical chemical polishing (CMP), but the difficulty in planar mounting and uniform polishing within several microns make it difficult to use of this mechanical method and achieve reliable device performance and high yield.

Flip-chip LEDs, one common alternative to vertical LEDs, have a more mature process, but the structure has less thermal dissipation ability due to the air gaps between the device and the heat sink. The mounting and packaging is also expensive when compared to vertical LEDs.

Accordingly, there is a need for a quasi-vertical light emitting diode that addresses these and other shortcomings of known light emitting devices and can achieve the desired performance requirements while reducing the technical challenges and achieving high yield.

SUMMARY

According to one embodiment of the present invention, method of making quasi-vertical light emitting devices is disclosed. The method includes growing a plurality of semiconductor layers on a growth substrate such as a sapphire substrate; etching the plurality of semiconductor layers to produce device isolation trenches forming a plurality of separable semiconductor devices and a plurality of holes; drilling a plurality of blind holes in the substrate at the location of each of the plurality of holes in the plurality of semiconductor layers, the plurality of blind holes drilled to a predetermined depth, wherein the drilling defines blind hole walls and a blind hole end in each of the plurality of blind holes; depositing n-semiconductor metal in each of the plurality of blind holes; forming an n-electrode contact in each of the plurality of blind holes by plating each of the plurality of blind holes with an n-electrode metal, the n-electrode metal connected to the n-semiconductor metal; thinning the substrate to expose the n-electrode metal as an n-electrode; and depositing bonding metal to the n-electrode for packaging.

According to one embodiment of the present invention, method of making quasi-vertical light emitting devices is disclosed. The method includes providing a sapphire substrate; growing a plurality of semiconductor layers on the sapphire substrate, the plurality of semiconductor layers including an n-GaN layer, an active layer, and a p-GaN layer; etching the plurality of semiconductor layers to produce device isolation trenches forming a plurality of separable semiconductor devices; etching the plurality of semiconductor layers to provide at least one hole in the plurality of semiconductor layers, the at least one hole etched to the sapphire substrate; etching an n-mesa in the active layer and the p-GaN layer; drilling at least one blind hole in the sapphire substrate at the location of the at least one hole in the plurality of semiconductor layer, the at least one sapphire hole drilled to a predetermined depth, wherein the drilling defines blind hole walls in each of the at least one blind hole; depositing a p-metal on the p-GaN layer; depositing an n-metal in the n-mesa; depositing an n-metal along the blind hole walls; plating the at least one blind hole with an n-electrode metal; filling each of the at least one blind hole to form an n-electrode contact; growing a passivation layer over all n metals; applying a p-electrode to the p-metal; thinning the sapphire substrate to expose the n-electrode contact; and dicing along the device isolation trenches to form a plurality of semiconductor devices.

According to another embodiment of the present invention, a quasi-vertical light emitting device is disclosed. The quasi-vertical light emitting device includes a sapphire substrate; a plurality of semiconductor layers grown on the sapphire substrate, the plurality of semiconductor layers including an n-GaN layer, an active layer, and a p-GaN layer; a plurality of holes etched in the plurality of semiconductor layers, each of the plurality of holes etched to the sapphire substrate, and a plurality of sapphire holes in the sapphire substrate, each of the plurality of holes aligned with one of the plurality of sapphire holes to form hole walls, the hole walls plated with an n-metal and each of the plurality of holes filled with an n-metal to form an n-electrode contact; an n-mesa in the active layer and the p-GaN layer, the n-mesa plated with an n-metal and a passivation layer grown over the n-metals; and a p-metal layer deposited on the p-GaN layer, and a p-electrode bonded to the p-metal.

Still other embodiments of the present invention will become readily apparent to those skilled in the art from the following detailed description, wherein embodiments of the invention are described by way of illustration. As will be realized, the invention is capable of other and different embodiments and its several details are capable of modifications in various respects, all without departing from the spirit and the scope of the present invention.

DETAILED DESCRIPTION

Figure 1:
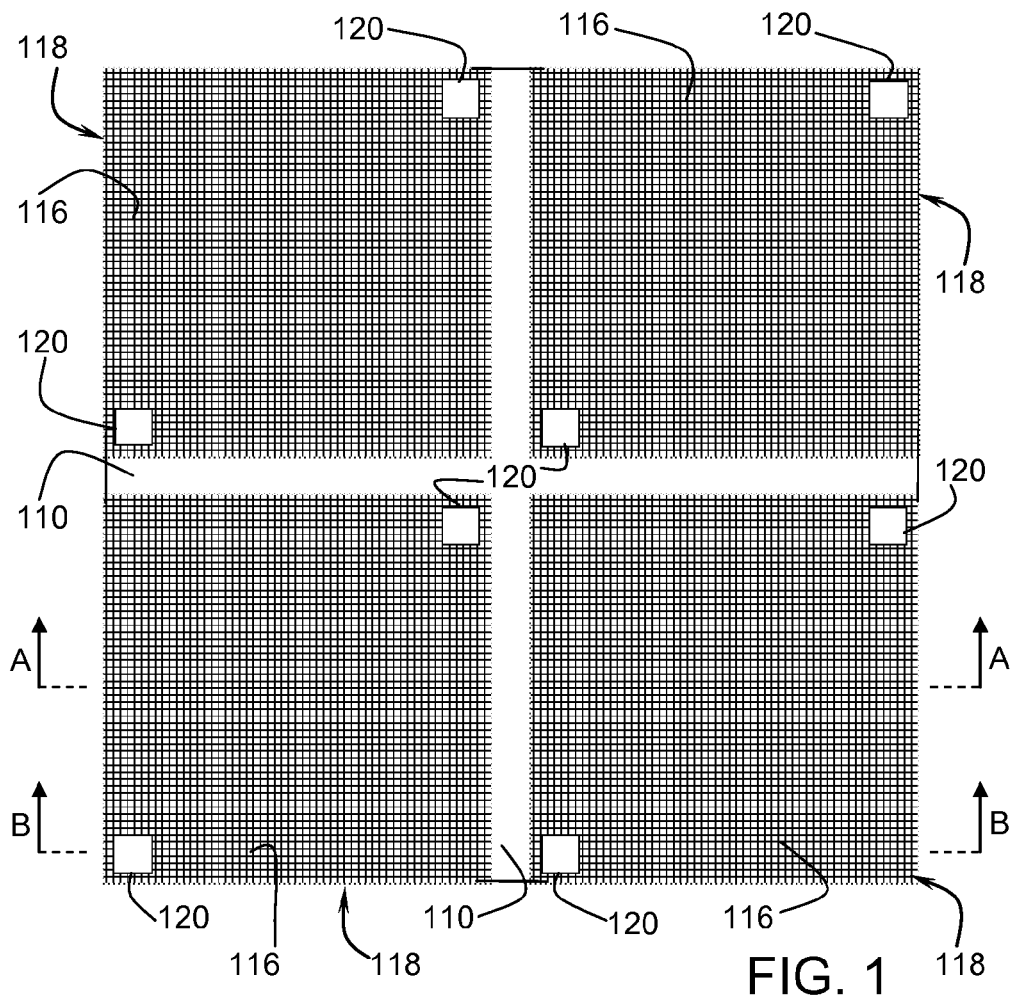
FIG. 1 is a partial plan view of a semiconductor structure, in accordance with an embodiment of the present invention.

In the following description, reference is made to the accompanying drawings where, by way of illustration, specific embodiments of the invention are shown. It is to be understood that other embodiments may be used as structural and other changes may be made without departing from the scope of the present invention. Also, the various embodiments and aspects from each of the various embodiments may be used in any suitable combinations. Accordingly, the drawings and detailed description are to be regarded as illustrative in nature and not as restrictive. In the drawings, like reference numbering has been used throughout to designate identical or equivalent elements.

Throughout the descriptions, use of the prefix "u-" stands for undoped or lightly doped, "p-" stands for p-type or positive, and "n-" stands for n-type or negative.

Generally, embodiments of the present invention are directed to a quasi-vertical light emitting diode (quasi-VLED). According to one embodiment of the quasi-VLED, blind holes are drilled into the growth substrate for the forming of an n-electrode contact. Therefore, complete removal of the growth substrate is not required to expose the n-electrode contact. FIGS. 1 to 26 illustrate an example process for fabricating a semiconductor structure for use as a quasi-vertical light emitting diode.

According to one embodiment of the present invention, the method includes providing a growth substrate; growing a plurality of semiconductor layers on the growth substrate; etching the plurality of semiconductor layers to produce device isolation trenches forming a plurality of separable semiconductor devices and a plurality of holes; drilling, by laser or dry etching, a plurality of blind holes in the sapphire substrate from semiconductor layer side, having the plurality of semiconductor layers, the plurality of holes drilled to a predetermined depth, wherein the drilling defines blind hole walls in each of the plurality of blind holes; and depositing metals by, for example, E-beam or sputtering to form ohmic contacts to the n-type semiconductor. The n-type conductor metals also cover the areas of the plurality of blind holes. The plating of the plurality of blind holes may use any suitable metal, such as copper or nickel. The metal plating is configured to make an electrical connection with the n-type semiconductor metals. Then, the side of the sapphire substrate without semiconductor layers is thinned to expose the plated metal. Other metals can be deposited onto the plated metal to form bonding pads of n-type semiconductor for the packaging of the LED.

Figure 2:
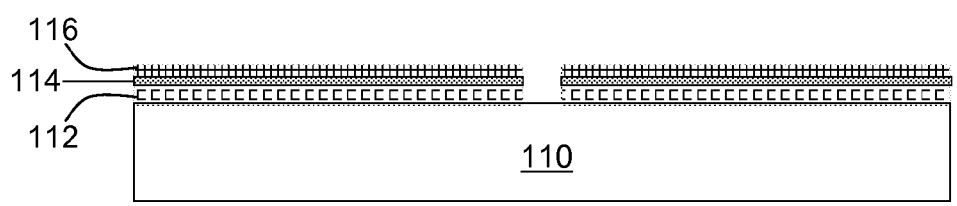
FIG. 2 is side cross sectional view of the semiconductor structure shown in FIG. 1 taken at line A, in accordance with an embodiment of the present invention.
Figure 3:
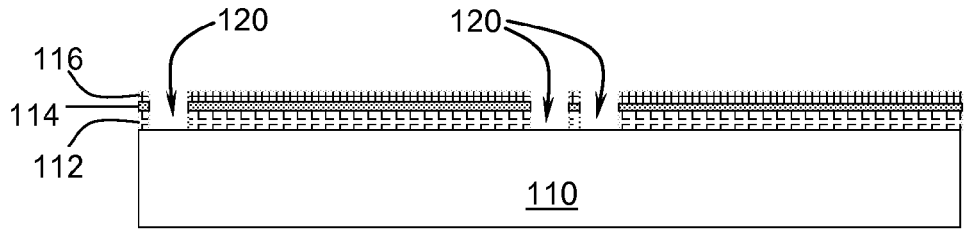
FIG. 3 is side cross sectional view of the semiconductor structure shown in FIG. 1 taken at line B, in accordance with an embodiment of the present invention.

Referring now to the figures, FIG. 1 is a partial plan view of a semiconductor structure, in accordance with an embodiment of the present invention. The semiconductor structure is any suitable semiconductor wafer or substrate. FIG. 2 is side cross sectional view of the semiconductor structure shown in FIG. 1 taken at line A, and FIG. 3 is side cross sectional view of the semiconductor structure shown in FIG. 1 taken at line B, in accordance with an embodiment of the present invention. Referring to FIGS. 1 to 3, the semiconductor structure shown includes a sapphire substrate 110, an undoped and doped n-GaN layer 112 grown on the sapphire substrate 110, an active layer 114 having multiple quantum wells grown on the n-GaN layer 112, and a p-GaN layer 116 is grown on the active layer 114. Mesa isolation is used to separate the semiconductor into separate dies 118. While four separate dies 118, are shown, FIG. 1 is only a partial view of the semiconductor structure and any suitable number of dies may be formed using embodiments of the present invention. Etching is also performed to define a plurality of holes 120 in the n-GaN layer 112, the active layer 114, and the p-GaN layer 116. Two holes 120 are formed in each die 118 as an n-electrode bonding area. The holes are shown as having a square shape but may have any suitable shape and location as needed by the specific device requirements.

Figure 4:
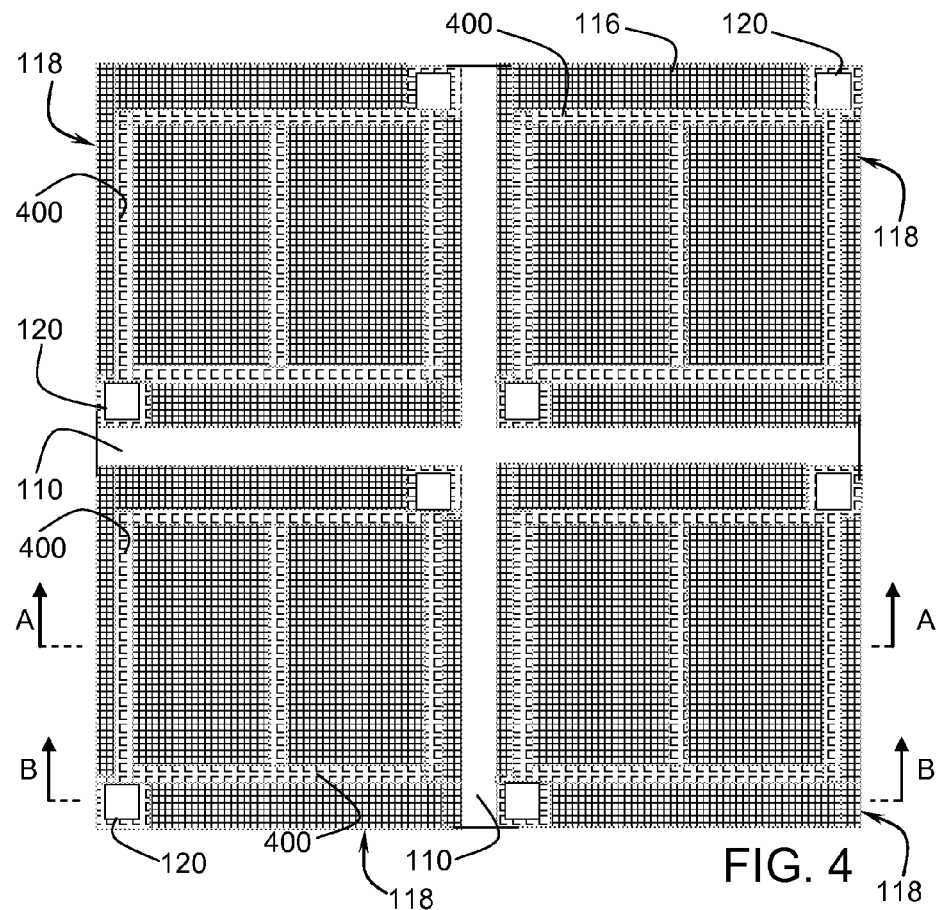
FIG. 4 is a partial plan view of the semiconductor structure, in accordance with an embodiment of the present invention.
Figure 5:
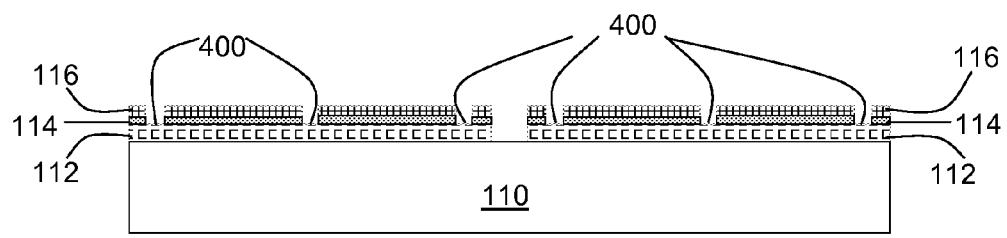
FIG. 5 is side cross sectional view of the semiconductor structure shown in FIG. 4 taken at line A, in accordance with an embodiment of the present invention.
Figure 6:
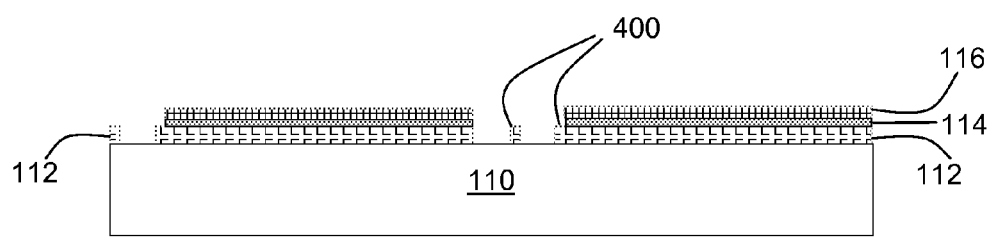
FIG. 6 is side cross sectional view of the semiconductor structure shown in FIG. 4 taken at line B, in accordance with an embodiment of the present invention.

Referring now to FIGS. 4 to 6, FIG. 4 is a partial plan view of the semiconductor structure, FIG. 5 is side cross sectional view of the semiconductor structure shown in FIG. 4 taken at line A, and FIG. 6 is side cross sectional view of the semiconductor structure shown in FIG. 4 taken at line B, in accordance with an embodiment of the present invention. An n-mesa 400 is etched into the active layer 114 and the p-GaN layer 118. The n-mesa 400 may be etched by ICP (inductively coupled plasma) etching or any other suitable etching method.

For clarity, FIGS. 7 to 26 illustrate a single die of the four shown in the semiconductor structure illustrated in FIGS. 1 to 6. However, any number of components may be similarly fabricated during the illustrated and described process.

Figure 7:
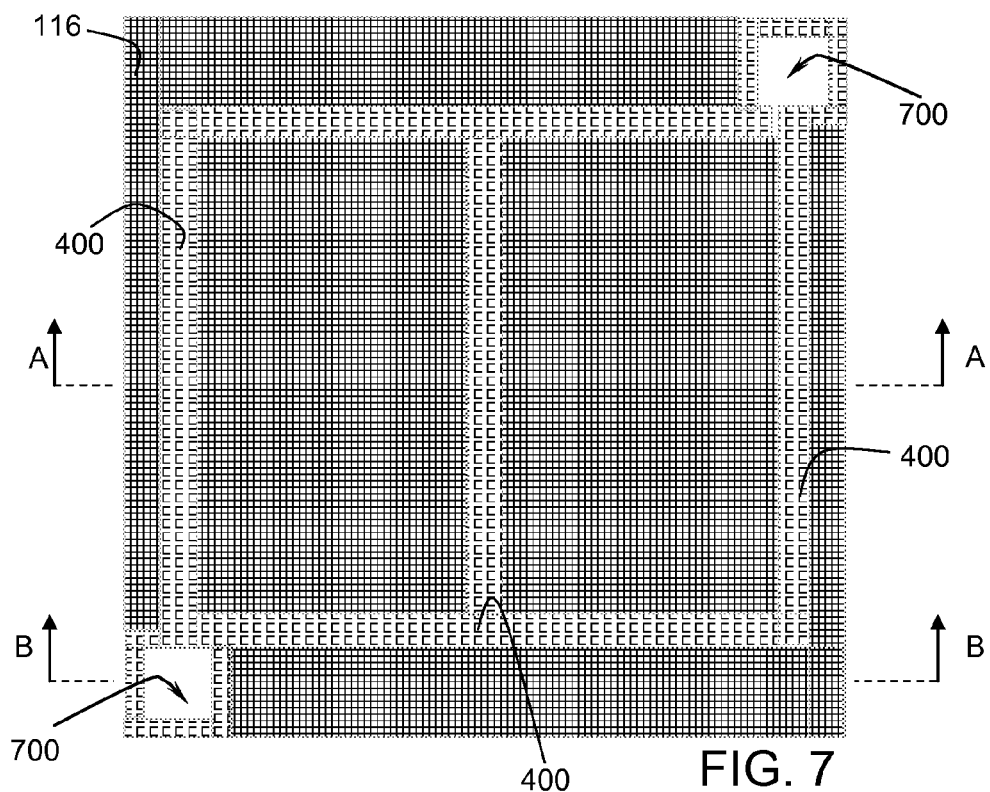
FIG. 7 is a partial plan view of the semiconductor structure, in accordance with an embodiment of the present invention.
Figure 8:
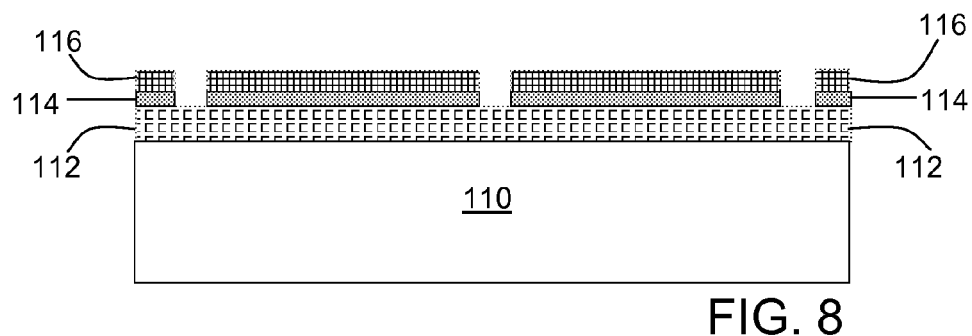
FIG. 8 is side cross sectional view of the semiconductor structure shown in FIG. 7 taken at line A, in accordance with an embodiment of the present invention.
Figure 9:
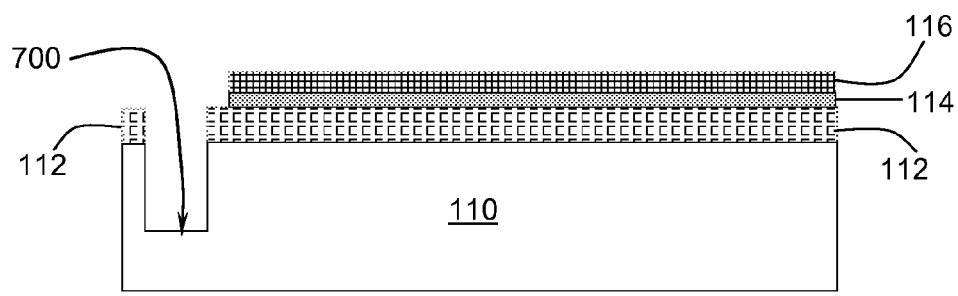
FIG. 9 is side cross sectional view of the semiconductor structure shown in FIG. 7 taken at line B, in accordance with an embodiment of the present invention.

Referring now to FIGS. 7 to 9, FIG. 7 is a partial plan view of the semiconductor structure, FIG. 8 is side cross sectional view of the semiconductor structure shown in FIG. 7 taken at line A, in accordance with an embodiment of the present invention, and FIG. 9 is side cross sectional view of the semiconductor structure shown in FIG. 7 taken at line B, in accordance with an embodiment of the present invention. A plurality of sapphire holes 700 are formed in to the sapphire layer 110. In one embodiment, sapphire drilling is performed by laser, dry etching, wet etching, or any other suitable method, to a predetermined depth at each of the locations where one of the holes 120 was etched. According to one embodiment, a suitable depth is greater than 5 um. Another to another embodiment, a suitable depth is greater than 10 um. According to another embodiment, one suitable depth is 30 um. However, these are example depths, and other depths may be used depending on the specific requirements of the device.

Figure 10:
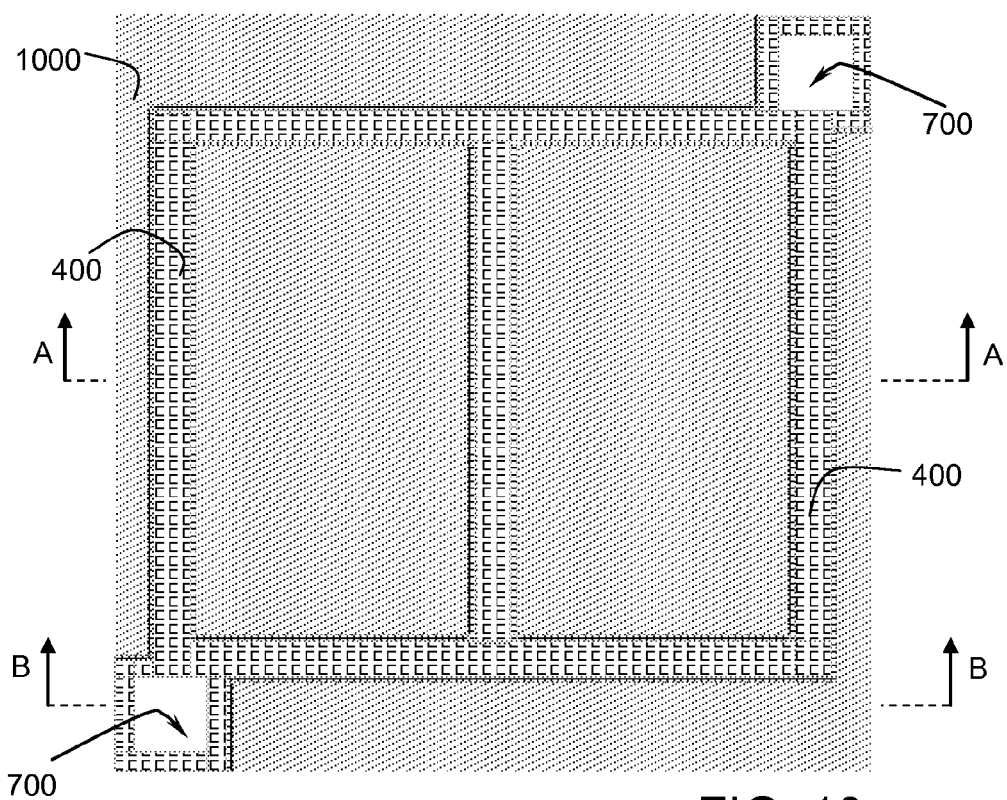
FIG. 10 is a partial plan view of the semiconductor structure, in accordance with an embodiment of the present invention.
Figure 11:
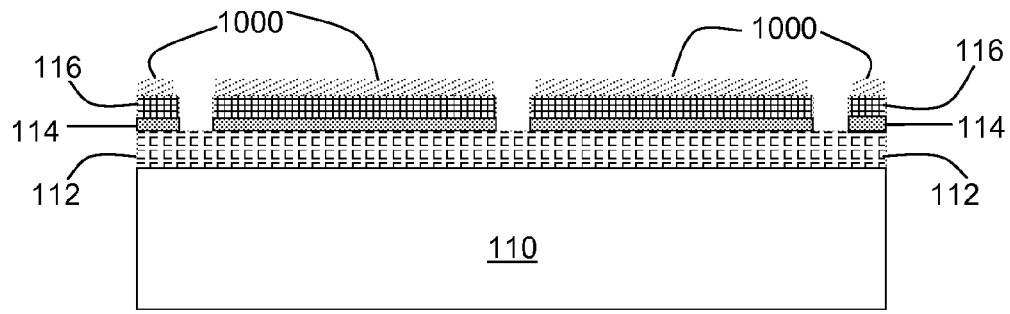
FIG. 11 is side cross sectional view of the semiconductor structure shown in FIG. 10 taken at line A, in accordance with an embodiment of the present invention.
Figure 12:
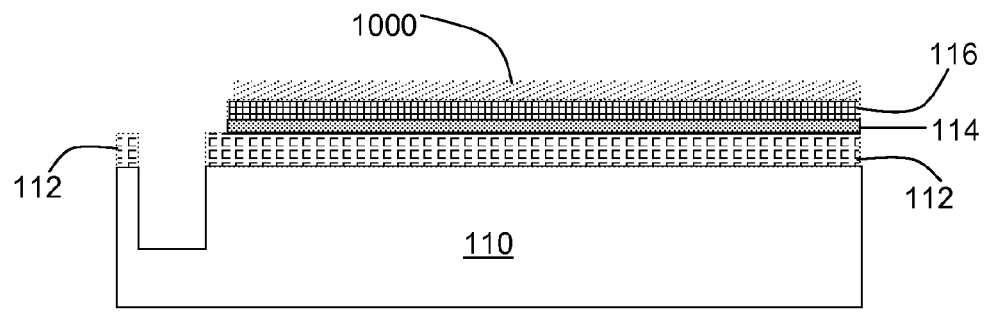
FIG. 12 is side cross sectional view of the semiconductor structure shown in FIG. 10 taken at line B, in accordance with an embodiment of the present invention.

Referring now to FIGS. 10 to 12, FIG. 10 is a partial plan view of the semiconductor structure, FIG. 11 is side cross sectional view of the semiconductor structure shown in FIG. 10 taken at line A, and FIG. 12 is side cross sectional view of the semiconductor structure shown in FIG. 10 taken at line B, in accordance with an embodiment of the present invention. A p-metal 1000 is deposited on the p-GaN layer, for example, by E-beam and lift-off. One example p-metal is Ni/Au. However, other suitable metals may be used.

Figure 13:
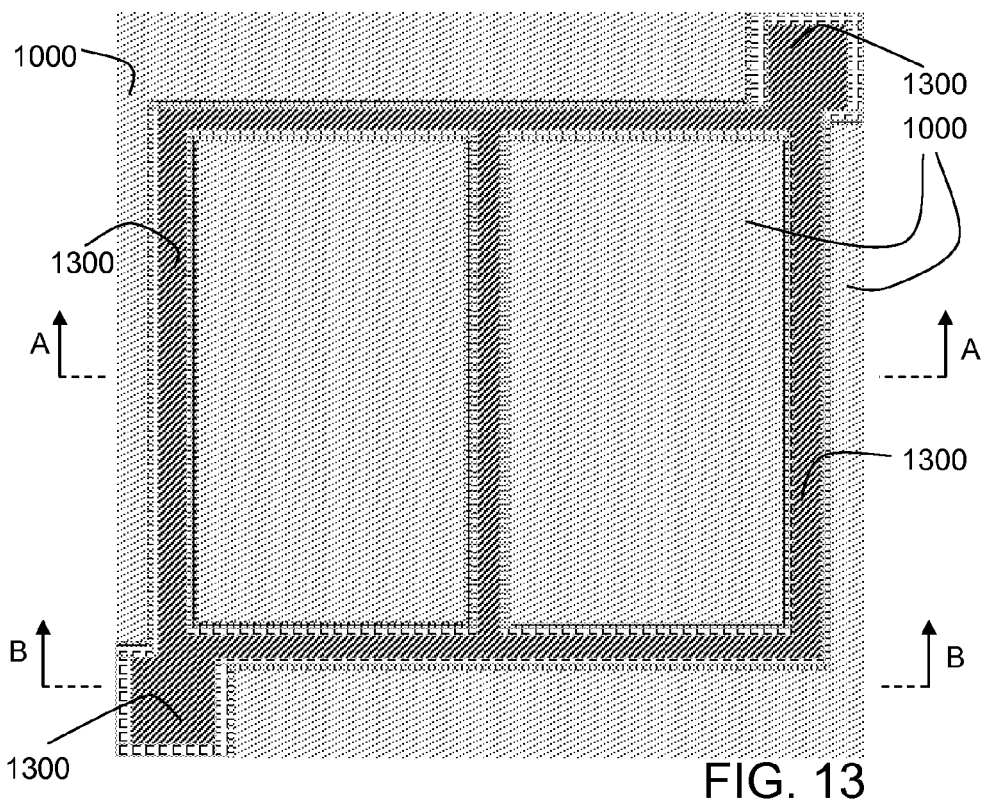
FIG. 13 is a partial plan view of the semiconductor structure, in accordance with an embodiment of the present invention.
Figure 14:
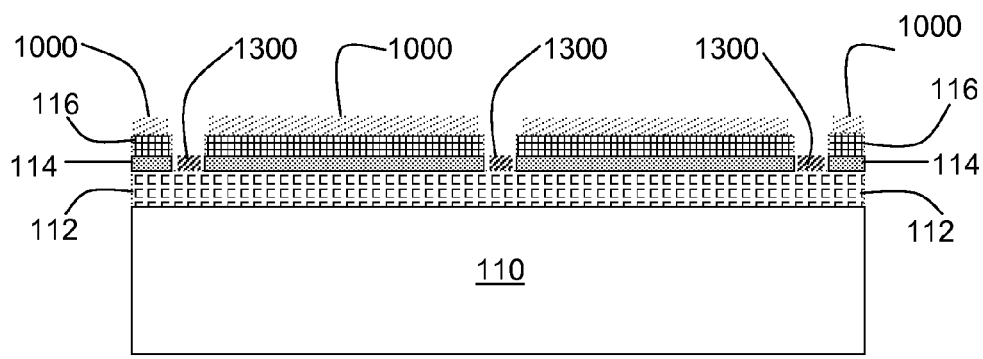
FIG. 14 is side cross sectional view of the semiconductor structure shown in FIG. 13 taken at line A, in accordance with an embodiment of the present invention.
Figure 15:
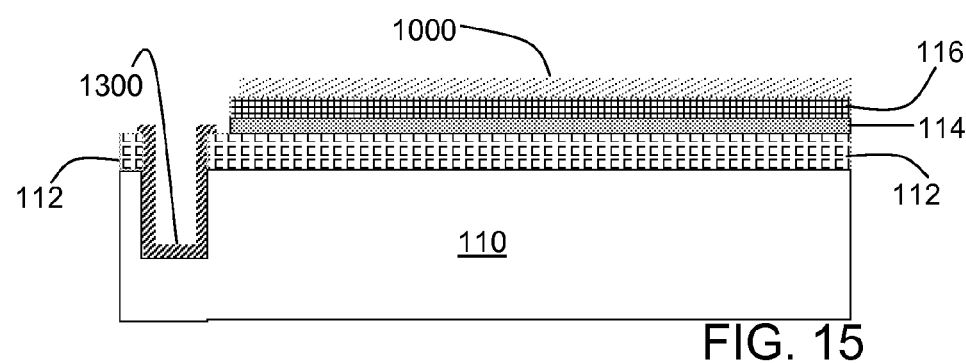
FIG. 15 is side cross sectional view of the semiconductor structure shown in FIG. 13 taken at line B, in accordance with an embodiment of the present invention.

Referring now to FIGS. 13 to 15, FIG. 13 is a partial plan view of the semiconductor structure, FIG. 14 is side cross sectional view of the semiconductor structure shown in FIG. 13 taken at line A, and FIG. 15 is side cross sectional view of the semiconductor structure shown in FIG. 13 taken at line B, in accordance with an embodiment of the present invention. An n-metal 1300 is deposited in the n-mesa 400 shown and described with reference to FIGS. 4 to 6. The n-metal 1300 is also deposited along walls and an end of the plurality of sapphire holes 700. The n-metal 1300 is deposited, for example, by E-beam and lift-off. One example n-metal is Ti/Al/Ti/Au.

Figure 16:
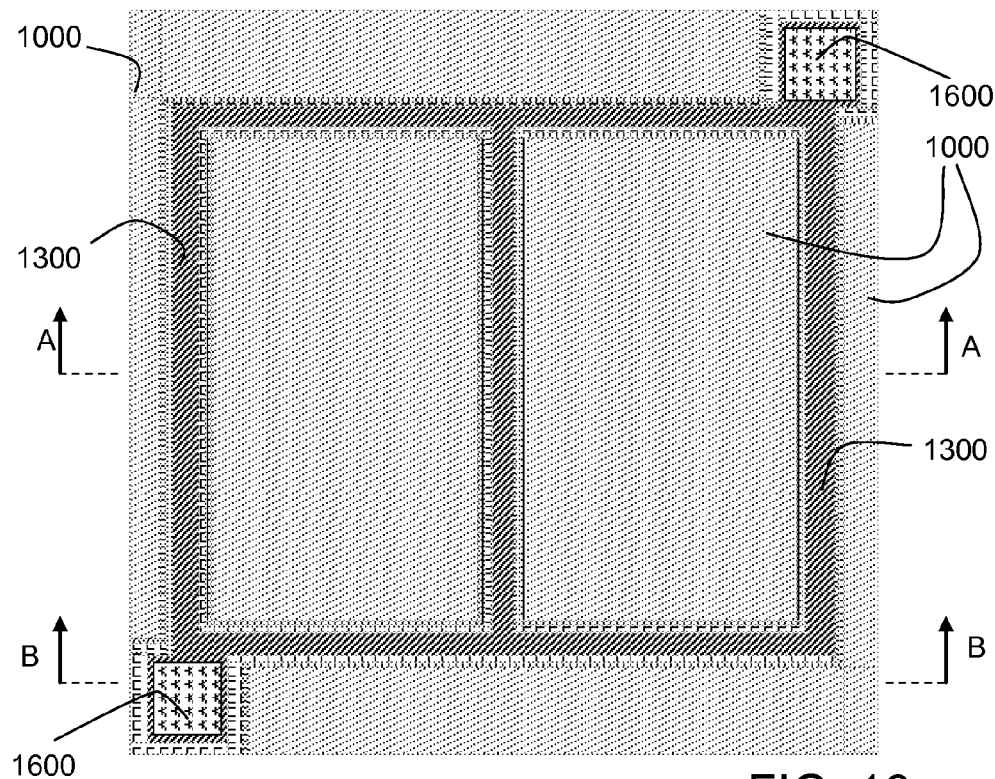
FIG. 16 is a partial plan view of the semiconductor structure, in accordance with an embodiment of the present invention.
Figure 17:
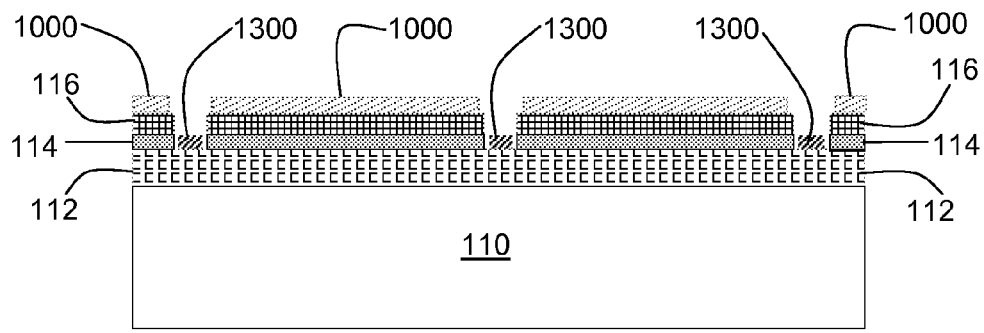
FIG. 17 is side cross sectional view of the semiconductor structure shown in FIG. 16 taken at line A, in accordance with an embodiment of the present invention.
Figure 18:
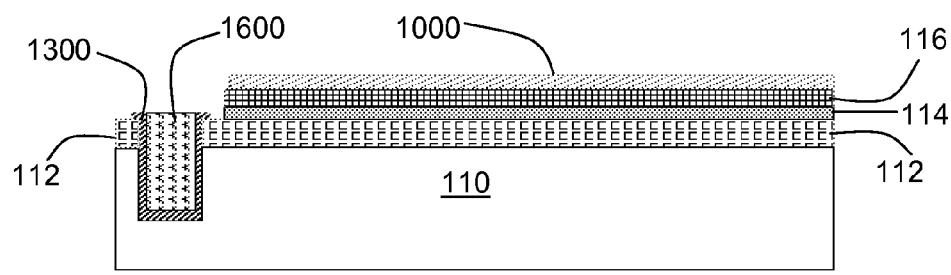
FIG. 18 is side cross sectional view of the semiconductor structure shown in FIG. 16 taken at line B, in accordance with an embodiment of the present invention.

Referring now to FIGS. 16 to 18, FIG. 16 is a partial plan view of the semiconductor structure, FIG. 17 is side cross sectional view of the semiconductor structure shown in FIG. 16 taken at line A, and FIG. 18 is side cross sectional view of the semiconductor structure shown in FIG. 16 taken at line B, in accordance with an embodiment of the present invention. Via/hole plating is performed to form an electrode contact 1600. The via/hole plating is performed by electroless plating or electro-plating, or any other suitable method to fill metal inside of the holes. One suitable metal is, for example, Ni or Cu.

Figure 19:
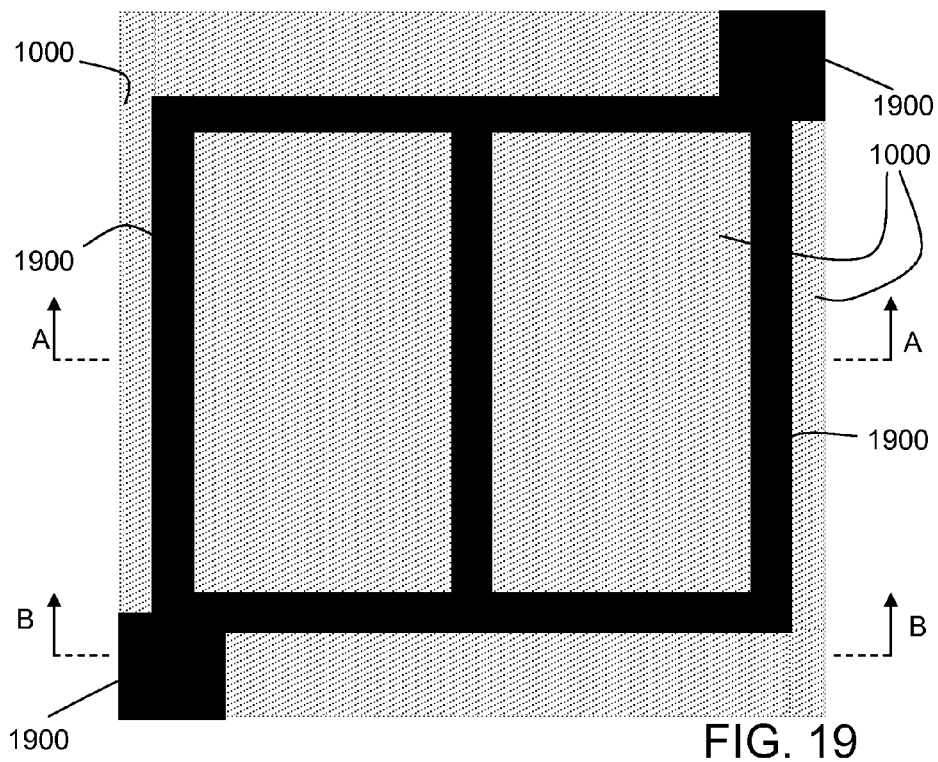
FIG. 19 is a partial plan view of the semiconductor structure, in accordance with an embodiment of the present invention.
Figure 20:
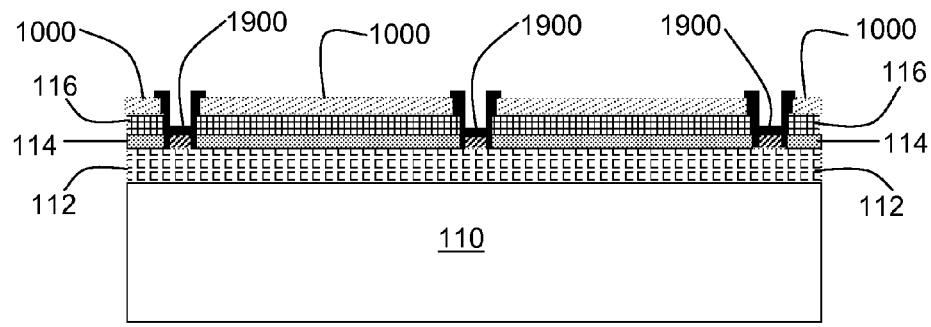
FIG. 20 is side cross sectional view of the semiconductor structure shown in FIG. 19 taken at line A, in accordance with an embodiment of the present invention.
Figure 21:
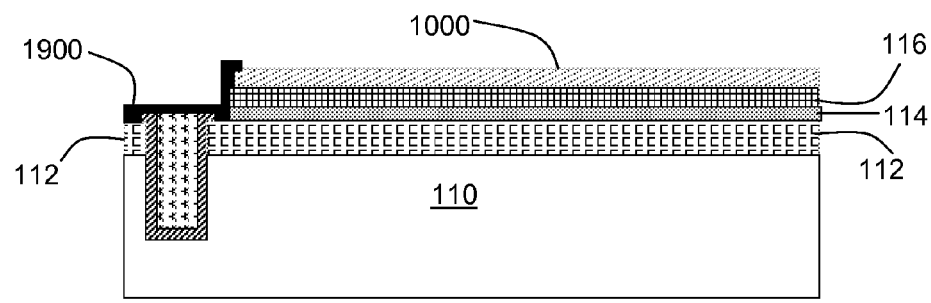
FIG. 21 is side cross sectional view of the semiconductor structure shown in FIG. 19 taken at line B, in accordance with an embodiment of the present invention.

Referring now FIGS. 19 to 21, FIG. 19 is a partial plan view of the semiconductor structure, FIG. 20 is side cross sectional view of the semiconductor structure shown in FIG. 19 taken at line A, FIG. 21 is side cross sectional view of the semiconductor structure shown in FIG. 19 taken at line B, in accordance with an embodiment of the present invention. A passivation layer 1900 is grown to cover all n metals so that now only the p metal is exposed. According to one embodiment, the passivation layer is a $SiO_2$ passivation layer.

Figure 22:
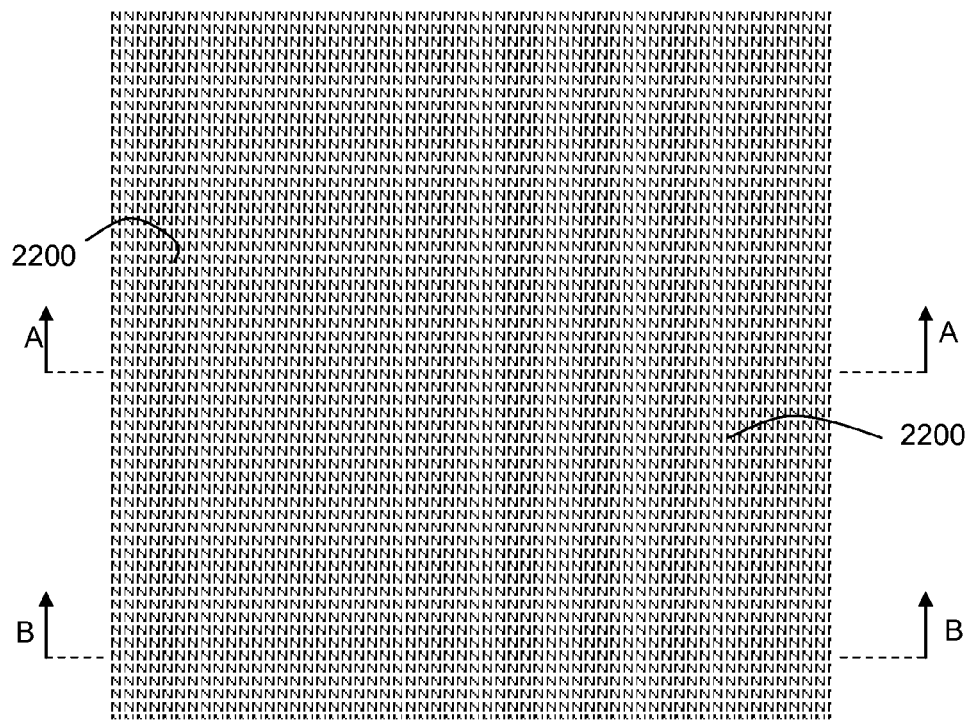
FIG. 22 is a partial plan view of the semiconductor structure, in accordance with an embodiment of the present invention.
Figure 23:
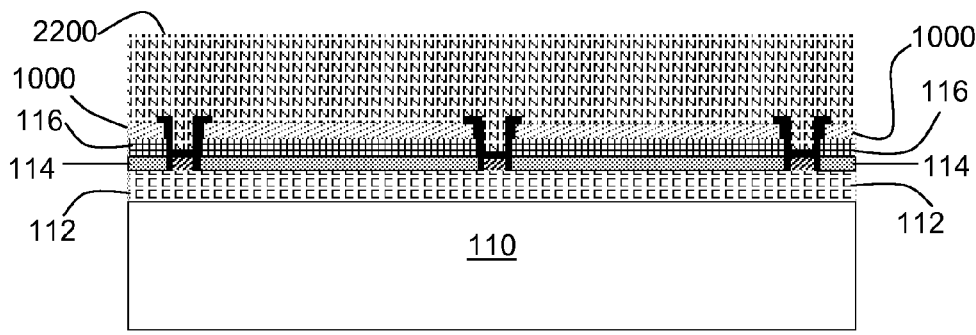
FIG. 23 is side cross sectional view of the semiconductor structure shown in FIG. 22 taken at line A, in accordance with an embodiment of the present invention.
Figure 24:
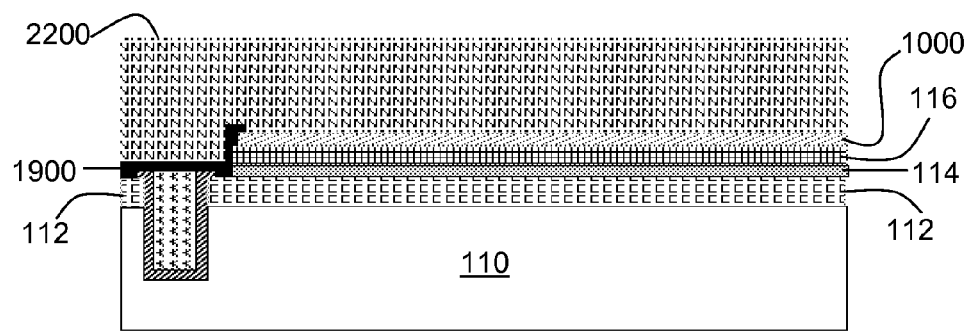
FIG. 24 is side cross sectional view of the semiconductor structure shown in FIG. 22 taken at line B, in accordance with an embodiment of the present invention.

Referring now to FIGS. 22 to 24, FIG. 22 is a partial plan view of the semiconductor structure, FIG. 23 is side cross sectional view of the semiconductor structure shown in FIG. 22 taken at line A, and FIG. 24 is side cross sectional view of the semiconductor structure shown in FIG. 22 taken at line B, in accordance with an embodiment of the present invention. A p-electrode 2200 is applied to the p-metal 1000 as a host substrate before sapphire substrate 110 is thinned. According to one embodiment, Cu is plated to the p-metal 1000. According to another embodiment, Si is bonded to the p-metal 1000. However, other conductive materials may be applied using any suitable method.

Figure 25:
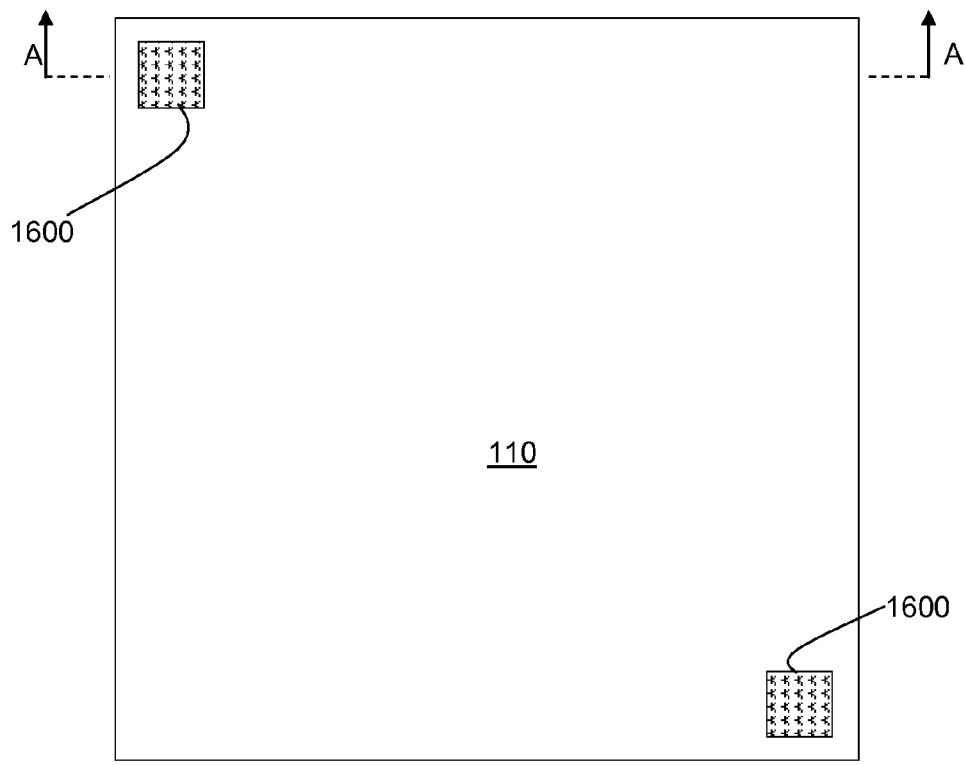
FIG. 25 is a partial plan view of the semiconductor structure, in accordance with an embodiment of the present invention.
Figure 26:
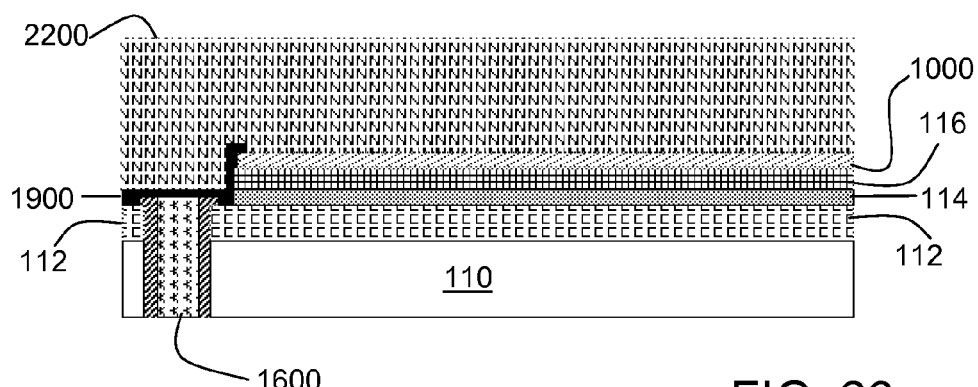
FIG. 26 is side cross sectional view of the semiconductor structure shown in FIG. 25 taken at line A, in accordance with an embodiment of the present invention.

Referring to FIGS. 25 and 26, FIG. 25 is a partial plan view of the sapphire side of the semiconductor structure, and FIG. 26 is side cross sectional view of the semiconductor structure shown in FIG. 25 taken at line A, in accordance with an embodiment of the present invention. Then the sapphire substrate 110 is thinned using a grinding, lapping, chemical mechanical polishing (CMP) or other suitable thinning method to expose the electrode contact 1600. The electrode contact 1600 is then exposed for contact with an n-electrode. As illustrated and described with reference to FIGS. 22 to 24, the other side of the semiconductor structure has the p-electrode 2200.

The semiconductor structure may then be diced into separate light emitting diodes. The quasi-vertical light emitting diodes made according to embodiments of the present invention may use vertical LED packaging, and avoid the need for any new, complex packaging process. According to one embodiment, mirrors can be added to reflect the light to the sapphire side of the device. Light extraction can also be improved by texturing the light emitting surface of the device.

Embodiments of the present invention provide a number of advantages over the prior art. For example, according to one embodiment, because the contact area between the p-electrode layer 2200, which is a good thermal and electrical conductor, and the active layer 114 is large, the heat dissipation and current spreading of p-GaN will be good, especially when compared to a flip-chip LED, which has gaps and can have less heat dissipation. Also, the Ohmic contact for the n-GaN layer may connect with conductive metals, such as Cu or Ni, along the side walls of the sapphire holes 700. Also, the ohmic contact metal (n-metal 1300) for the n-GaN layer 112 is connected to the n-GaN layer 112 on the same side of the n-GaN layer 112 as the electrode metals (p-metal 1000) for the p-GaN layer 116. Therefore, the complete removal of the sapphire substrate 110 is not necessary. The uniformity tolerance for mechanical thinning is decided by the depth of the hole drilled or etched into sapphire, and the tolerance is therefore greater than that required for the complete removal of sapphire. According to one embodiment, the mechanical thinning is stopped before reaching the active layer or before getting close to the active layer, so the performance of device will not be degraded by the mechanical damage and the yield can be improved.

While the invention has been particularly shown and described with reference to the illustrated embodiments, those skilled in the art will understand that changes in form and detail may be made without departing from the spirit and scope of the invention. For example, while embodiments of the invention have been describe with reference to GaN devices, embodiments of the present invention may also be used with nitride-based semiconductors, lasers, and any other suitable opto-electrical devices. Additionally, while certain example materials and processes have been described, other suitable materials and processes may be used.

Accordingly, the above description is intended to provide example embodiments of the present invention, and the scope of the present invention is not to be limited by the specific examples provided.

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A method of making quasi-vertical light emitting devices, the method comprising:
   growing a plurality of semiconductor layers on a growth substrate;
   etching the semiconductor layers to produce device isolation trenches forming a plurality of separable semiconductor devices and a plurality of holes;
   drilling a plurality of blind holes in the substrate at the location of each of the plurality of holes in the semiconductor layers, the blind holes drilled to a predetermined depth, wherein the drilling defines blind hole walls and a blind hole end in each of the blind holes;
   depositing n-semiconductor metal in each of the blind holes;
   forming an n-electrode contact in each of the blind holes by plating each of the blind holes with an n-electrode metal, the n-electrode metal connected to the n-semiconductor metal;
   thinning the substrate to expose the n-electrode metal as an n-electrode; and
   depositing bonding metal to the n-electrode for packaging.

2. The method of claim 1, wherein the depth of each of the blind holes is greater than 5 um.

3. The method of claim 1, further comprising:
   depositing n-metal along the blind hole walls; and
   filling the blind hole walls with metal to form an n-electrode contact.

4. The method of claim 3, wherein the step of thinning the substrate includes using a mechanical thinning method to thin the substrate to expose the n-electrode contact.

5. The method of claim 3, further comprising:
   the plurality of semiconductor layers comprises an n-GaN layer, an active layer, and a p-GaN layer;
   etching an n-mesa;
       depositing an n-metal in the n-mesa;
   depositing a p-metal on the p-GaN layer;
   growing a passivation layer over all n metals;
   applying a p-electrode to the p-metal; and
   dicing along the device isolation trenches to form a plurality of semiconductor devices.

6. The method of claim 1 wherein, the growth substrate is a sapphire substrate.

7. A method of making quasi-vertical light emitting devices, the method comprising:
   growing a plurality of semiconductor layers on a sapphire substrate, the semiconductor layers including an n-GaN layer, an active layer, and a p-GaN layer;
   etching the semiconductor layers to produce device isolation trenches forming a plurality of separable semiconductor devices;
   etching the semiconductor layers to provide at least one hole in the semiconductor layers, the at least one hole etched to the sapphire substrate;
   etching an n-mesa in the active layer and the p-GaN layer;
   drilling at least one blind hole in the sapphire substrate at the location of the at least one hole in the semiconductor layers, the at least one blind hole drilled to a predetermined depth, wherein the drilling defines blind hole walls in each of the at least one blind hole;
   depositing a p-metal on the p-GaN layer;
   depositing an n-metal in the n-mesa;
   depositing an n-metal along the blind hole walls;
   plating the at least one blind hole with an n-electrode metal;
   filling each of the at least one blind hole to form an n-electrode contact;
   growing a passivation layer over all n metals;
   applying a p-electrode to the p-metal;
   thinning the sapphire substrate to expose the n-electrode contact; and
   dicing along the device isolation trenches to form a plurality of semiconductor devices.

8. The method of claim 7, wherein the at least one blind hole is drilled from the growth side semiconductor layer.

9. The method of claim 7, wherein the depth of the at least one blind hole is greater than 5 um.

10. The method of claim 7, wherein the n-electrode contact is copper, the at least one blind hole filled with copper by electroless plating to form the n-electrode contact.

11. The method of claim 7, wherein the n-electrode contact is copper, the at least one blind hole filled with copper by electro plating to form the n-electrode contact.

12. The method of claim 7, wherein the n-electrode contact is nickel, the at least one blind hole filled with nickel by electroless plating to form the n-electrode contact.

13. The method of claim 7, wherein the n-electrode contact is nickel, the at least one blind hole filled with nickel by electro plating to form the n-electrode contact.

14. The method of claim 7, wherein the p-electrode is silicon or copper.

15. The method of claim 7, wherein the p-electrode is a large area p-electrode, the p-electrode has a size approximately equal to one of the plurality of separable semiconductor devices.

16. The method of claim 7, wherein the step of thinning the sapphire substrate includes using a mechanical thinning method to thin the sapphire substrate to expose the n-electrode contact.

17. The method of claim 7, wherein the n-metal is connected to the n-GaN layer on the same side of the n-GaN layer as the p-metal is connected to the p-GaN layer.

* * * * *